United States Patent
Agarwal et al.

[11] Patent Number: 6,165,834
[45] Date of Patent: *Dec. 26, 2000

[54] METHOD OF FORMING CAPACITORS, METHOD OF PROCESSING DIELECTRIC LAYERS, METHOD OF FORMING A DRAM CELL

[75] Inventors: Vishnu K. Agarwal; Garo J. Derderian; Gurtej S. Sandhu, all of Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/074,638

[22] Filed: May 7, 1998

[51] Int. Cl.$^7$ .............................................. H01L 21/8242
[52] U.S. Cl. .............................. 438/240; 438/3; 438/396; 438/386; 438/393; 438/253; 438/627; 438/381; 257/310; 257/295; 257/751
[58] Field of Search ........................................ 438/240, 3

[56] References Cited

U.S. PATENT DOCUMENTS

| | | |
|---|---|---|
| 4,333,808 | 6/1982 | Bhattacharyya et al. |
| 4,464,701 | 8/1984 | Roberts et al. ........................... 361/313 |
| 4,891,682 | 1/1990 | Yusa et al. ................................. 357/30 |
| 4,952,904 | 8/1990 | Johnson et al. ............................. 338/36 |
| 5,053,917 | 10/1991 | Miyasaka et al. ...................... 361/321 |
| 5,079,191 | 1/1992 | Shinriki et al. ........................... 437/235 |
| 5,111,355 | 5/1992 | Anand et al. ............................. 361/313 |
| 5,142,438 | 8/1992 | Reinberg et al. ........................ 361/313 |
| 5,191,510 | 3/1993 | Huffman .................................. 361/313 |
| 5,234,556 | 8/1993 | Oishi et al. ........................ 204/157.51 |
| 5,279,985 | 1/1994 | Kamiyama et al. ...................... 437/60 |
| 5,293,510 | 3/1994 | Takenaka ................................. 257/295 |
| 5,316,982 | 5/1994 | Taniguchi ................................. 437/236 |
| 5,330,935 | 7/1994 | Dobuzinsky et al. ................... 437/239 |
| 5,335,138 | 8/1994 | Sandhu et al. ........................... 361/303 |
| 5,348,894 | 9/1994 | Gnade et al. ............................. 437/12 |
| 5,352,623 | 10/1994 | Kamiyama ................................. 437/52 |
| 5,362,632 | 11/1994 | Mathews .................................. 437/47 |
| 5,372,859 | 12/1994 | Thakoor .................................. 427/551 |
| 5,397,446 | 3/1995 | Ishihara et al. ..................... 204/192.18 |
| 5,442,213 | 8/1995 | Okudaira ................................. 257/310 |

(List continued on next page.)

FOREIGN PATENT DOCUMENTS

| | | |
|---|---|---|
| 1-222469 | 5/1989 | Japan . |
| 04162527A | 10/1990 | Japan . |
| 403209869A | 9/1991 | Japan . |
| 5-221644 | 8/1993 | Japan . |
| 405343641 | 12/1993 | Japan ................................... 257/310 |
| 5-343641 | 12/1993 | Japan ................................... 257/310 |
| 6-021333 | 1/1994 | Japan . |

OTHER PUBLICATIONS

H. Shinriki and M. Nakata, *IEEE Transaction On Electron Devices*, vol. 38 No. 3, Mar. 1991.

(List continued on next page.)

*Primary Examiner*—Matthew Smith
*Assistant Examiner*—Belur Keshavan
*Attorney, Agent, or Firm*—Wells, St. John, Roberts, Gregory & Matkin P.S.

[57] ABSTRACT

The invention comprises methods of forming capacitors, methods of processing dielectric layers, and methods of forming a DRAM cell. In one implementation, a method of processing a dielectric layer comprises forming a high K oxygen containing dielectric layer over a substrate. The high K dielectric layer is annealed at a temperature of at least about 200° C. and at a pressure of at least about 50 Torr in an ozone comprising atmosphere. In another implementation, annealing of the high K dielectric layer is conducted at a temperature of at least about 200° C. and at a pressure of at least about 0.1 Torr in an ozone comprising atmosphere which is void of plasma. Pressures of greater than one atmosphere are most preferred. In another implementation, annealing of the high K capacitor dielectric layer is conducted at a substrate temperature of at least about 300° C. in an activated oxygen atmosphere produced at least in part from oxygen subjected to remote microwave plasma. The processing is ideally implemented in capacitor fabrication, and more particularly in DRAM circuitry fabrication.

30 Claims, 3 Drawing Sheets

U.S. PATENT DOCUMENTS

| | | |
|---|---|---|
| 5,466,629 | 11/1995 | Mihara et al. .............................. 437/60 |
| 5,468,687 | 11/1995 | Carl et al. ................................. 437/235 |
| 5,471,364 | 11/1995 | Summerfelt et al. ................ 361/321.4 |
| 5,504,041 | 4/1996 | Summerfelt ............................... 437/235 |
| 5,508,953 | 4/1996 | Fukuda et al. ........................... 365/145 |
| 5,510,651 | 4/1996 | Maniar et al. ............................. 257/75 |
| 5,552,337 | 9/1996 | Kwon et al. ............................... 437/60 |
| 5,555,486 | 9/1996 | Kingon et al. ........................... 361/305 |
| 5,561,307 | 10/1996 | Mihara et al. ........................... 257/295 |
| 5,585,300 | 12/1996 | Summerfelt . |
| 5,617,290 | 4/1997 | Kulwicki et al. ..................... 361/325.4 |
| 5,641,702 | 6/1997 | Imai et al. . |
| 5,654,222 | 8/1997 | Sandhu et al. .............................. 438/3 |
| 5,663,088 | 9/1997 | Sandhu et al. ........................... 438/396 |
| 5,668,040 | 9/1997 | Byun ....................................... 438/396 |
| 5,688,724 | 11/1997 | Yoon et al. ............................... 437/235 |
| 5,728,603 | 3/1998 | Emesh et al. ............................. 437/235 |
| 5,741,626 | 4/1998 | Jain et al. ................................. 430/314 |
| 5,780,359 | 7/1998 | Brown et al. ........................... 438/659 |
| 5,786,248 | 7/1998 | Schuegraf ................................ 438/240 |
| 5,790,366 | 8/1998 | Desu et al. ............................... 361/305 |
| 5,798,903 | 8/1998 | Dhote et al. .......................... 361/321.4 |
| 5,807,774 | 9/1998 | Desu et al. . |
| 5,814,852 | 9/1998 | Sandhu et al. ........................... 257/310 |
| 5,834,345 | 11/1998 | Shimizu . |
| 5,837,591 | 11/1998 | Shimada et al. ......................... 438/381 |
| 5,837,593 | 11/1998 | Park et al. ............................... 438/396 |
| 5,838,035 | 11/1998 | Ramesh .................................. 257/295 |
| 5,843,830 | 12/1998 | Graettinger et al. .................... 438/396 |
| 5,844,771 | 12/1998 | Graettinger et al. .................... 361/303 |
| 5,872,696 | 2/1999 | Peters et al. ............................. 361/305 |
| 5,888,295 | 3/1999 | Sandhu et al. . |
| 5,899,740 | 5/1999 | Kwon ..................................... 438/627 |
| 5,910,218 | 6/1999 | Park et al. ............................... 118/719 |
| 5,910,880 | 6/1999 | DeBoer et al. .......................... 361/311 |
| 5,916,634 | 6/1999 | Fleming et al. ...................... 427/255.2 |
| 5,919,531 | 7/1999 | Arkles et al. ............................ 427/576 |
| 5,930,584 | 7/1999 | Sun et al. .................................... 438/3 |
| 5,933,316 | 8/1999 | Ramakrishnan et al. ............... 361/311 |
| 5,955,758 | 9/1999 | Sandhu et al. ........................... 257/306 |
| 5,970,369 | 10/1999 | Hara et al. . |
| 5,990,507 | 11/1999 | Mochizuki et al. . |
| 6,010,744 | 1/2000 | Buskirk et al. . |
| 6,015,989 | 1/2000 | Horikawa et al. . |
| 6,027,969 | 2/2000 | Huang et al. . |
| 6,028,360 | 2/2000 | Nakamura et al. . |
| 6,046,469 | 4/2000 | Yamazaki et al. . |
| 6,051,859 | 4/2000 | Hosotani et al. . |

OTHER PUBLICATIONS

S. Wolf and R.N. Tauber, Silicon Processing for the VLSI Era, vol. 2, Lattice Press, pp. 589–591, 1990.

McIntyre, Paul C. et al., "Kinetics And Mechanisms of TiN Oxidation Beneath Pt/TiN Films", *J. Appl. Phys.*, vol. 82, No. 9, pp. 4577–4585 (Nov. 1997).

Onishi, Shigeo et al., "A Half–Micron Ferroelectric Memory Cell Technology With Stacked Capacitor Structure", *I.E.E.E.*, IDEM 94–843, pp. 843–846 (1994).

Eimori, T., et al. "Newly Designed Planar Stacked Capacitor Cell with High Dielectric Constant Film for 256Mbit DRAM" *I.E.E.E.*, IEDM 93–631–4, pp. 631–634 (1993).

Fazan, P.C., et al., "High–C Capacitor (20.4fF/$\mu m^2$) with Ultrathin CVD–$Ta_2O_5$ Films Deposited on Rugged Poly–Si for High Density DRAMs", *I.E.E.E.*, pp. 263–266 (1992).

Lesaicherre, P–Y, et. al., "A Gbit–Scale DRAM Stacked Capacitor Technology with ECR MOCVD $SrTiO_3$ and RIE Patterned $RuO_2$/TiN Storage Nodes", *I.E.E.E.*, pp. 831–834 (1994).

Yamaguchi, H., et al., "Structural and Electrical Characterization of $SrTiO_3$ Thin Films Prepared by Metal Organic Chemical Vapor Deposition", *Jpn. J. Appl. Phys.*, vol. 32 (Pt. 1, No. 9B), pp. 4069–4073 (1993).

Kamiyama, S., et. al., "Highly Reliable 2.5nm $Ta_2O_5$ Capacitor Process Technology for 256Mbit DRAMs", *I.E.E.E.*, pp. 827–830 (1991).

Kamiyama, S., et. al., "Ultrathin Tantalum Oxide Capacitor Dielectric Layers Fabricated Using Rapid Thermal Nitridation Prior to Low Pressure Chemical Vapor Deposition", *J. Electrochem. Soc.*, vol. 140, No. 6, pp. 1617–1625 (Jun. 1993).

H. Shinriki and M. Nakata, IEEE Transaction On Electron Devices vol. 38 No. 3 Mar. 1991.

U.S. application No. 09/059,057, Agarwal et al., filed Apr. 10, 1998.

U.S. application No. 09/033,063, Al–Shareef et al., filed Feb. 28, 1998.

U.S. application No. 09/033,064, Al–Shareef et al., filed Feb. 28, 1998.

U.S. application No. 09/058,612, Agarwal et al., filed Apr. 10, 1998.

U.S. application No. 09/137,780, Al–Shareef et al., filed Aug. 20, 1998.

U.S. application No. 09/083,257, Al–Shareef et al., filed May 21, 1998.

U.S. application No. 08/858,027, Sandhu et al., filed May 16, 1997.

U.S. application No. 08/738,789, Sandhu et al., filed Oct. 29, 1996.

U.S. application No. 08/881,561, Sandhu et al., filed Jun. 24, 1997.

U.S. application No. 09/086,389, Sandhu et al., filed May 28, 1998.

U.S. application No. 09/122,473, Schuegraf, filed Jul. 23, 1998.

U.S. application No. 09/098,035, DeBoer et al., filed Jun. 15, 1998.

U.S. application No. 09/185,412, Graettinger et al., filed Nov. 3, 1998.

U.S. application No. 08/944,054, Parekh et al., filed Dec. 18, 1997.

U.S. application No. 08/916,771, DeBoer et al., filed Aug. 20, 1997.

U.S. application No. 08/670,644, Graettinger et al.

U.S. application No. 08/542,430, Schuegraf.

U.S. application No. 09/229,518, Deboer et al., filed Jan. 13, 1999.

M.A. Farooq, S.P. Murarka, C.C. Chang, F.A. Baiocchi, Tantalum nitride as a dissusion barrier between $Pd_2Si$, $CoSi_2$ and aluminum, 1989 American Institute of Physics, pp. 3017–3022.

Anonymous Research Disclosure, 1989R D–0299041 titled "Double High Dielectric", *Derwent World Patent Index;* Derwent–Week 19817.

U.S. application No. 08/994,054, Kunal R. Parekh et al., filed Dec. 19, 1997.

METHOD OF FORMING CAPACITORS, METHOD OF PROCESSING DIELECTRIC LAYERS, METHOD OF FORMING A DRAM CELL

TECHNICAL FIELD

This invention relates to methods of forming capacitors, to methods of processing dielectric layers, and to methods of forming DRAM cells.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Insulating inorganic metal oxide materials, such as ferroelectric materials or perovskite material or pentoxides such as tantalum pentoxide, have high dielectric constants and low leakage current which make them attractive as cell dielectric materials for high density DRAMs and non-volatile memories. Perovskite material and other ferroelectric materials exhibit a number of unique and interesting properties. One such property of a ferroelectric material is that it possesses a spontaneous polarization that can be reversed by an applied electric field. Specifically, these materials have a characteristic temperature, commonly referred to as the transition temperature, at which the material makes a structural phase change from a polar phase (ferroelectric) to a non-polar phase, typically called the paraelectric phase.

Despite the advantages of high dielectric constants and low leakage, insulating inorganic metal oxide materials suffer from many drawbacks. For example, all of these materials incorporate oxygen or are otherwise exposed to oxygen for densification to produce the desired capacitor dielectric layer. Unfortunately, the provision of such layers or subjecting such layers to oxidation densification also undesirably oxidizes the underlying bottom or lower storage node plate, which is typically conductively doped polysilicon. For example, $Ta_2O_5$ is typically subjected to an anneal in the presence of an oxygen ambient. The anneal drives any carbon present out of the layer and advantageously injects additional oxygen into the layer such that the layer uniformly approaches a stoichiometry of five oxygen atoms for every two tantalum atoms. The oxygen anneal is commonly conducted at a temperature of from about 400° C. to about 1000° C. utilizing one or more of $O_3$, $N_2O$ and $O_2$. The oxygen containing gas is typically flowed through a reactor at a rate of from about 0.5 slm to about 10 slm.

The art accepted solution to avoiding oxidation of underlying silicon is to provide an intervening oxidation barrier layer between the underlying conductive polysilicon and overlying insulating inorganic metal oxide dielectric layer. This layer is accordingly desirably electrically conductive, as the underlying polysilicon will be in electrical connection with the insulating inorganic metal oxide dielectric layer.

There are a limited number of oxidation barrier materials which are conductive. Elemental platinum (a conductive oxidation barrier) on polysilicon has been suggested as a composite layer or construction for a lower capacitor plate, but undergoes physical degradation with thermal cycling due to silicon diffusion through the platinum. Sputtered TiN and CVD TiN (other conductive barriers) have been known to fail due to diffusion along grain boundaries.

Further even with oxidation barriers, some oxidation of the underlying silicon can and does occur the more elevated the oxidation anneal temperature. High temperature anneals in non-oxidizing atmospheres have been used as a substitute for the oxygen anneal. Such have the advantage of achieving or repairing crystal structure without oxidizing the underlying silicon. However, the lack of oxygen prevents significant densification and homogenous production of the stoichiometric oxide. Thus, less than desirable dielectric constant will typically be achieved.

SUMMARY OF THE INVENTION

The invention comprises methods of forming capacitors, methods of processing dielectric layers, and methods of forming a DRAM cell. In one implementation, a method of processing a dielectric layer comprises forming a high K oxygen containing dielectric layer over a substrate. The high K dielectric layer is annealed at a temperature of at least about 200° C. and at a pressure of at least about 50 Torr in an ozone comprising atmosphere. In another implementation, annealing of the high K dielectric layer is conducted at a temperature of at least about 200° C. and at a pressure of at least about 0.1 Torr in an ozone comprising atmosphere which is void of plasma. Pressures of greater than one atmosphere are most preferred. In another implementation, annealing of the high K capacitor dielectric layer is conducted at a substrate temperature of at least about 300° C. in an activated oxygen atmosphere produced at least in part from oxygen subjected to remote microwave plasma. The processing is ideally implemented in capacitor fabrication, and more particularly in DRAM circuitry fabrication.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
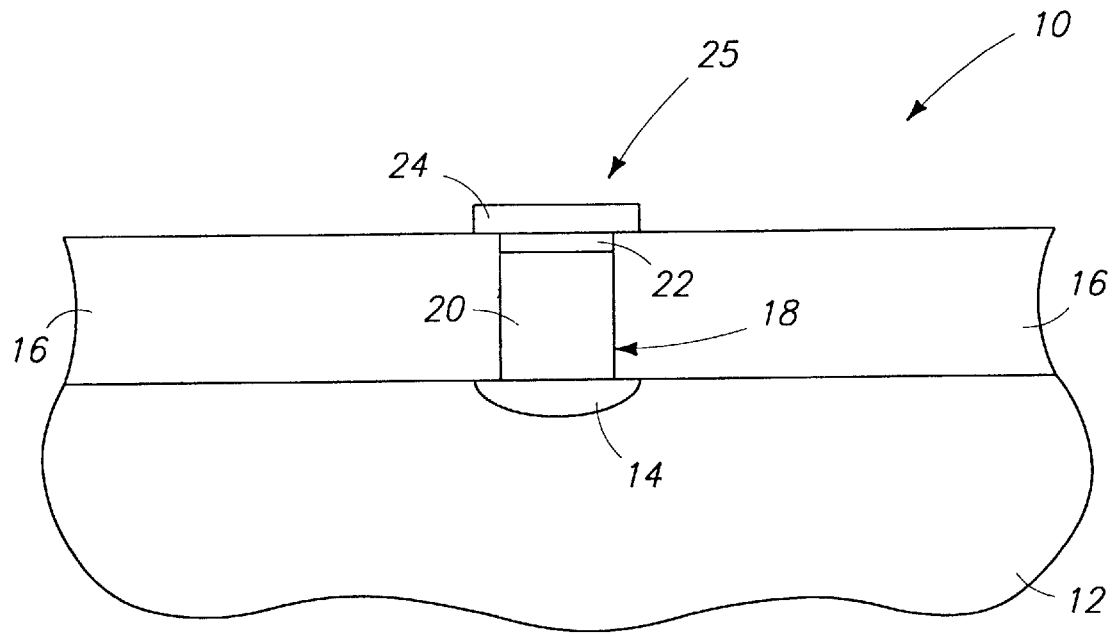
FIG. 1 is a diagrammatic view of a semiconductor wafer fragment at one processing step in accordance with the invention.

Referring to FIG. 1, a semiconductor wafer fragment or substrate is indicated generally with reference numeral 10. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Fragment 10 comprises a bulk monocrystalline silicon substrate 12 having a conductive diffusion region 14 formed therein. An insulating dielectric layer 16, such as borophosphosilicate glass, is formed over bulk wafer 12 and is provided to have a planar upper surface. A contact opening 18 is formed through insulating layer 16 to diffusion region 14. Conductive plugging materials 20 and 22 fill opening 18. An example and preferred composition for material 20 is conductively doped polysilicon. Such can be formed, for example, by chemical vapor deposition using $SiH_4$ as a precursor gas at a temperature of 535° C. and a pressure of 200 mTorr. The material of layer 22 is preferably chosen to function as a diffusion barrier layer to oxidation of the preferred silicon material 20. Example materials are ruthenium and titanium nitride. For example, TiN can be formed by chemical vapor deposition using an organic precursor. An example process utilizes precursors of $((CH_3)_2N)_4Ti$ at 150 sccm and $N_2$ at 80 sccm at a substrate temperature of 420° C. and a pressure of 0.7 Torr.

The illustrated plugging construction can be produced by initially forming conductively doped polysilicon to completely fill opening 18. Such layer can then be etched back by wet or dry etches, or by chemical-mechanical polishing, to a point where all of conductive material 20 has been removed from over the upper surface of insulating layer 16, with the removal technique being continued to slightly recess material 20 within opening 18. Conductive material 22 is then deposited and planarized back, such as by chemical-mechanical polishing.

Another conductive layer 24, preferably for example ruthenium dioxide, is formed over layer 22 and is patterned to form a first capacitor electrode 25. An example process for chemical vapor depositing $RuO_x$ would be at a pressure of 1 Torr and a temperature of 175° C., with precursor feeds of Ru(tricarbonyl cyclohexdienyl) at 300 sccm and $O_2$ at 300 sccm. In preferred embodiments, the first capacitor electrode is configured to at least one of, a) contain silicon, or b) be formed proximately over silicon. As here described and intended to be shown, preferred capacitor electrode 25 is fabricated to be formed proximately over silicon material 20, with layer 22 serving as an intervening diffusion barrier layer which is conductive.

Figure 2:
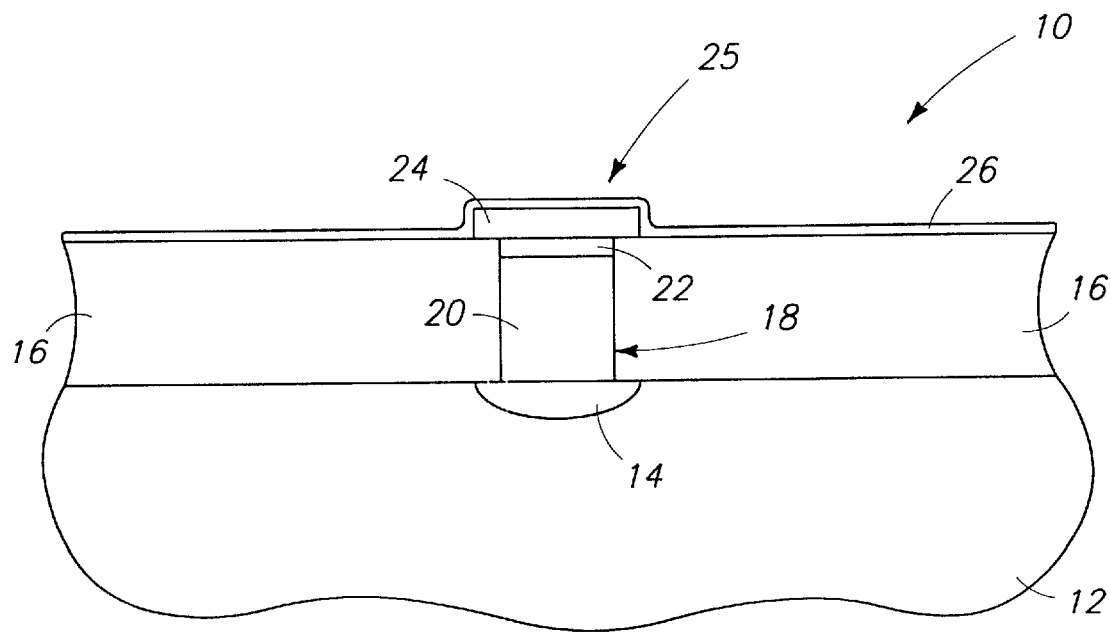
FIG. 2 is a view of the FIG. 1 wafer at a processing step subsequent to that depicted by FIG. 1.

Referring to FIG. 2, a high dielectric constant (K) oxygen, containing capacitor dielectric layer 26 is formed over first capacitor electrode 25. In the context of this document, "high K" defines any a dielectric constant of at least 15. Example and preferred materials for layer 26 are (Ba, Sr)$TiO_3$, $SrTiO_3$, (Pb, Zr)$TiO_3$, $Ta_2O_5$, and $Nb_2O_5$. As one example, a process for depositing (Ba, Sr)$TiO_3$ includes utilizing precursors of Ba(DPM)$_2$, Sr(DPM)$_2$ and Ti(OC$_3$H$_7$)$_4$, $O_2$ at 0.5 Torr and 650° C., where "DPM" denotes "dipivaloylmethanato". The oxide can be substantially amorphous or crystalline as formed depending in large part upon the processing temperature, with a substantially crystalline layer being formed from the above precursor gases at a temperature of 650° C. In the context of this document, "substantially amorphous" is meant to define a material which is at least 90% amorphous.

Substrate 10 and accordingly high K capacitor dielectric layer 26 are then subjected to an annealing in an ozone-comprising atmosphere. Such annealing is preferably conducted at a substrate temperature of at least about 200° C. and to pressure of at least about 50 Torr. Alternately, such annealing is preferably conducted at a substrate temperature of at least about 200° C. and at a pressure of least about 0.1 Torr where the atmosphere is void of plasma. More preferably, the annealing is conducted at a pressure of at least 1 atmosphere, with a pressure greater than 1 atmosphere and less than or equal to 5 atmospheres being even more preferred. A preferred upper temperature limit is 800° C., with annealing more preferably being conducted at or below 500° C. Oxygen flow during the annealing is preferably between about 50 sccm and 3000 sccm, with such gas flow preferably constituting from 5% to 20% $O_3$ by weight and from 95% to 80% $O_2$ by weight. The ozone gas is preferably generated by passing a flow of from 50 sccm to 2000 sccm $O_2$ through an ultraviolet light ozone generator. Exemplary times for treatment are expected to be from anywhere from 30 seconds to 5 minutes. Such annealing can result in significantly improved leakage characteristics and high critical voltage or breakdown voltage.

Plasma is preferably not utilized during processing to avoid highly directional flow of oxygen atoms from the ozone in the direction of the high K capacitor dielectric layer being annealed. Such highly directional flow created by a plasma can have a tendency to not completely and uniformly process a high K capacitor dielectric layer which is not substantially planar. For example, formation of a high K capacitor dielectric layer over elevational steps or within contact openings under plasma treatment can result in less processing of the steeper, vertical portions of the capacitor dielectric layer than those received over substantially horizontal surfaces.

Also preferably, the anneal treatment is conducted in the presence of UV light in the processing chamber provided from a suitable source. An exemplary light and power is 248 nm and 1000 W. Such additional UV light during the anneal further converts additional $O_2$ to ozone within the anneal chamber during processing, and thus facilitates insertion of interstitial oxygen into the layer.

Alternately or in addition, the annealing is conducted at a substrate temperature of at least about 300° C. in an activated oxygen atmosphere produced at least in part from oxygen subjected to remote microwave plasma. An example feed to a remote microwave plasma generator would be oxygen gas at 1000 sccm with microwave power being at from 500 W to 4 kW. Such will effectively dissociate the oxygen molecules into activated oxygen atoms which are then fed to the annealing chamber. Ozone as well might be generated and present during the annealing. Preferred annealing conditions under these circumstances are a substrate temperature from about 300° C. to about 700° C., with about 500° C. being most preferred. Preferred pressure is from about 1 Torr to 5 atmospheres, with about 10 Torr being more preferred.

Figure 3:
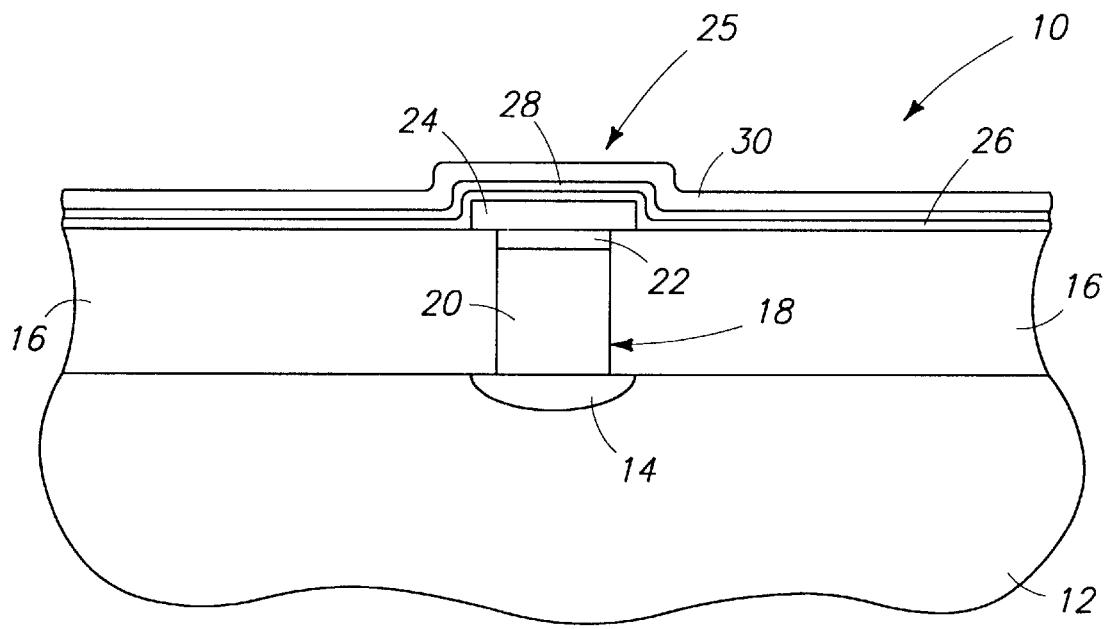
FIG. 3 is a view of the FIG. 1 wafer at a processing step subsequent to that depicted by FIG. 2.
Figure 4:
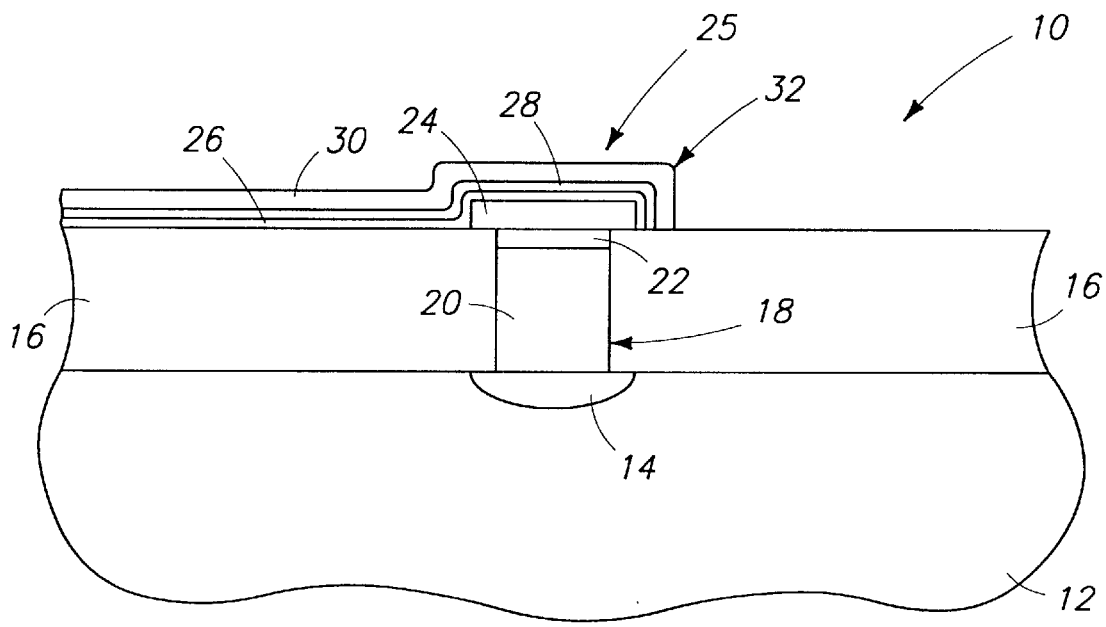
FIG. 4 is a view of the FIG. 1 wafer at a processing step subsequent to that depicted by FIG. 3.

Referring to FIG. 3, a diffusion barrier layer 28 is formed over layer 26, with TiN being an example. A second capacitor electrode layer 30 is formed over layer 28 and accordingly also over high K oxygen capacitor dielectric layer 26. Such is patterned to produce a second capacitor electrode 32 (FIG. 4.) Accordingly in the preferred embodiment, the subject annealing is conducted prior to formation of any portion of second capacitor electrode 32. This will minimize in the illustrated example risk of oxidation of the preferred polysilicon of layer 30 from any out-diffusion of oxygen from the high K capacitor dielectric layer. Layer 30 could of course comprise other conductive materials, such as TiN, WN, Pt, WSiN, Ru, $RuO_x$, Ir, $IrO_x$, etc.

The invention was principally motivated from the perspective of capacitor dielectric layer fabrication. The artisan will of course appreciate applicability of the invention with respect to processing of any high K oxygen-containing dielectric layer regardless of whether being formed in a capacitor.

Figure 5:
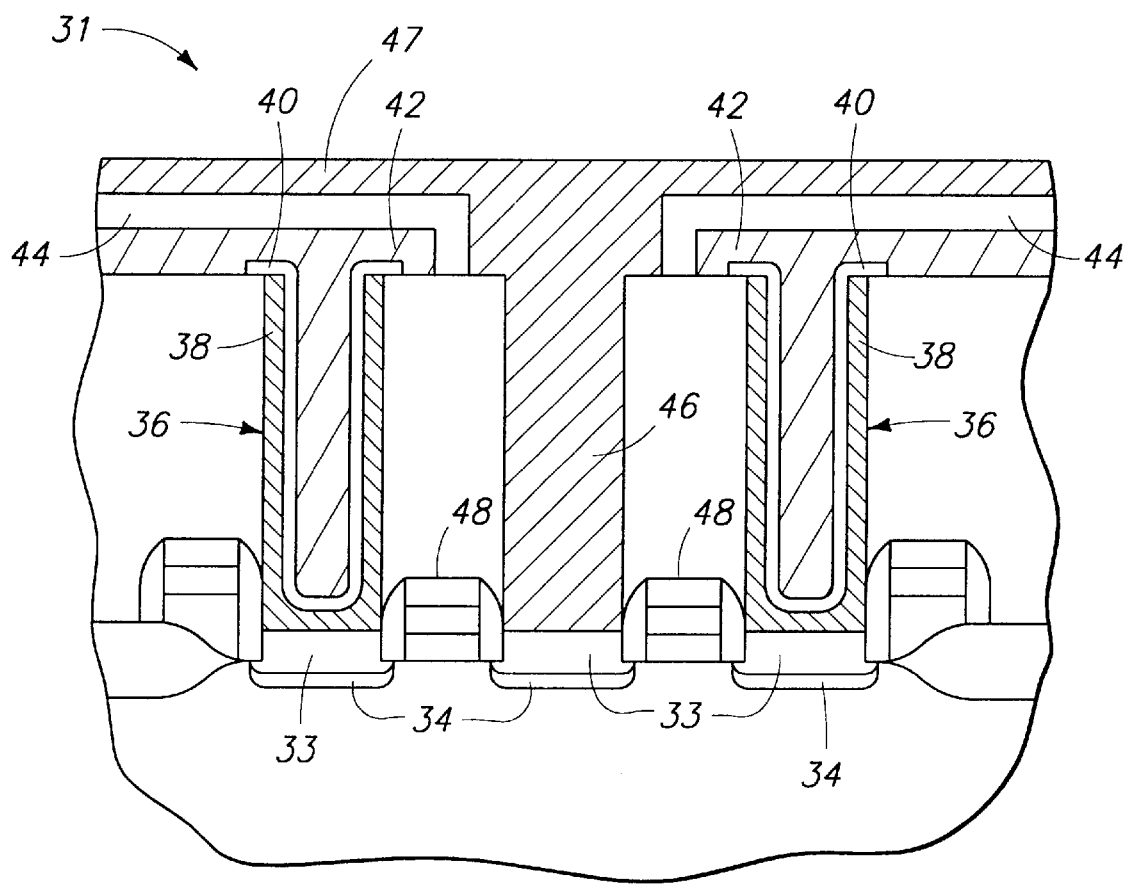
FIG. 5 is a view an alternate embodiment semiconductor wafer fragment in accordance with the invention.

FIG. 5 depicts implementation of the invention in fabrication of DRAM circuitry. A wafer fragment 31 comprises two memory cells, with each comprising a capacitor 36 and a shared bit contact 46. Capacitors 36 electrically connect with substrate diffusion regions 34 through silicide regions 33. For simplicity, capacitors 36 are shown as comprising a first capacitor electrode 38, a capacitor dielectric layer 40, and a second capacitor electrode/cell plate 42. Such can be fabricated of materials described above, preferably to include silicon, barrier layers and a high K oxygen containing capacitor dielectric layer. The high K oxygen containing capacitor dielectric layer is preferably processed as described above. A dielectric layer 44 is formed over second capacitor plate 42. A bit line 47 is fabricated in electrical connection with bit contact 46. Word lines 48 are fabricated to enable selective gating of the capacitors relative to bit contact 46.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a capacitor comprising:
   forming a first capacitor electrode over a substrate;
   forming a high K oxygen containing capacitor dielectric layer over the first capacitor electrode;
   annealing the high K dielectric layer at a substrate temperature of at least about 200° C. and at a pressure of greater than 1 atmosphere in an atmosphere comprising ozone and which is void of plasma, effective to densify the high K capacitor dielectric layer; and
   forming a second capacitor electrode over the high K oxygen containing capacitor dielectric layer.

2. The method of claim 1 wherein the annealing is conducted at a pressure of at least 2 atmospheres.

3. The method of claim 2 wherein the annealing is conducted at a pressure of less than or equal to 5 atmospheres.

4. The method of claim 1 wherein the annealing is conducted in the presence of ozone generating ultraviolet light.

5. The method of claim 1 wherein the annealing is conducted before forming the second capacitor electrode.

6. The method of claim 1 wherein the annealing substrate temperature is less than or equal to about 800° C.

7. A method of processing a dielectric layer comprising:
   forming a high K oxygen containing dielectric layer over a substrate; and
   annealing the high K dielectric layer at a substrate temperature of at least about 200° C. and at a pressure of greater than 1 atmosphere in an atmosphere comprising ozone and which is void of plasma, effective to densify the high K capacitor dielectric layer.

8. The method of claim 7 wherein the annealing is conducted at a pressure of at least atmospheres.

9. The method of claim 8 wherein the annealing is conducted at a pressure of less than or equal to 5 atmospheres.

10. The method of claim 7 wherein the annealing is conducted in the presence of ozone generating ultraviolet light.

11. The method of claim 16 wherein the annealing substrate temperature is less than or equal to about 800° C.

12. A method of forming a capacitor comprising:
    forming a first capacitor electrode over a substrate;
    forming a high K oxygen containing capacitor dielectric layer over the first capacitor electrode;
    annealing the high K capacitor dielectric layer at a substrate temperature of at least about 200° C. in an activated oxygen atmosphere to produced at least in part from oxygen subjected to remote microwave plasma, and the annealing atmosphere being void of plasma; and forming a second capacitor electrode over the high K oxygen containing capacitor dielectric layer.

13. The method of claim 12 wherein the annealing is conducted at a pressure of at least 0.1 Torr and less than 20 Torr.

14. The method of claim 12 wherein the annealing is conducted at a pressure of at least 1 atmosphere effective to densify the high K capacitor dielectric layer.

15. The method of claim 12 wherein the annealing is conducted at a pressure of greater than 1 atmosphere and less than or equal to 5 atmospheres.

16. The method of claim 12 wherein the annealing is conducted in the presence of ozone.

17. The method of claim 12 wherein the annealing is conducted before forming the second capacitor electrode.

18. The method of claim 12 wherein the annealing substrate temperature is less than or equal to about 800° C.

19. The method of claim 12 wherein the annealing is conducted at a pressure of at least 1 atmosphere effective to reduce leakage current of the high K capacitor dielectric layer.

20. A method of forming a DRAM cell comprising:
    forming a first capacitor electrode over a substrate;
    forming a high K oxygen containing capacitor dielectric layer over the first capacitor electrode;
    annealing the high K capacitor dielectric layer at a substrate temperature of at least about 200° C. and at a pressure of greater than 1 atmosphere in an atmosphere comprising ozone and which is void of plasma, effective to densify the high K capacitor dielectric layer;
    forming a second capacitor electrode over the high K oxygen containing capacitor dielectric layer; and
    providing a field effect transistor having a pair of source/drain regions, one of the source/drain regions being provided in electrical connection with the first capacitor electrode, the other of the source/drain regions being provided in electrical connection with a bit line.

21. The method of claim 20 wherein the annealing is conducted at a pressure of at least 2 atmospheres.

22. The method of claim 21 wherein the annealing is conducted at a pressure of less than or equal to 5 atmospheres.

23. The method of claim 20 wherein the annealing is conducted in the presence of ozone generating ultraviolet light.

24. The method of claim 20 wherein the annealing is conducted before forming the second capacitor electrode.

25. The method of claim 20 wherein the annealing substrate temperature is less than or equal to about 800° C.

26. A method of forming a DRAM cell comprising:

forming a first capacitor electrode over a substrate;

forming a high K oxygen containing capacitor dielectric layer over the first capacitor electrode;

annealing the high K capacitor dielectric layer at a substrate temperature of at least about 300° C. in an activated oxygen atmosphere produced at least in part from oxygen subjected to remote microwave plasma, and the annealing atmosphere being void of plasma;

forming a second capacitor electrode over the high K oxygen containing capacitor dielectric layer; and providing a field effect transistor having a pair of source/drain regions, one of the source/drain regions being provided in electrical connection with the first capacitor electrode, the other of the source/drain regions being provided in electrical connection with a bit line.

27. The method of claim 26 wherein the annealing substrate temperature is less than or equal to about 800° C.

28. A method of forming a capacitor comprising:

forming a first capacitor electrode over a substrate;

forming a high K oxygen containing capacitor dielectric layer over the first capacitor electrode;

annealing the high K capacitor dielectric layer at a substrate temperature of at least about 200° C. and at a pressure of greater than 1 atmosphere in an atmosphere comprising ozone and which is void of plasma, effective to reduce leakage current of the high K capacitor dielectric layer; and forming a second capacitor electrode over the high K oxygen containing capacitor dielectric layer.

29. A method of processing a dielectric layer comprising:

forming a high K oxygen containing dielectric layer over a substrate; and annealing the high K dielectric layer at a substrate temperature of at least about 200° C. and at a pressure of greater than 1 atmosphere in an atmosphere comprising ozone and which is void of plasma, effective to reduce leakage current of the high K capacitor dielectric layer.

30. A method of forming a DRAM cell comprising:

forming a first capacitor electrode over a substrate;

forming a high K oxygen containing capacitor dielectric layer over the first capacitor electrode;

annealing the high K capacitor dielectric layer at a substrate temperature of at least about 200° C. and at a pressure of greater than 1 atmosphere in an atmosphere comprising ozone and which is void of plasma, effective to reduce leakage current of the high K capacitor dielectric layer;

forming a second capacitor electrode over the high K oxygen containing capacitor dielectric layer; and providing a field effect transistor having a pair of source/drain regions, one of the source/drain regions being provided in electrical connection with the first capacitor electrode, the other of the source/drain regions being provided in electrical connection with a bit line.

* * * * *

UNITED STATES PATENT AND TRADEMARK OFFICE
CERTIFICATE OF CORRECTION

PATENT NO : 6,165,834
DATED : December 26, 2000
INVENTOR(S) : Vishnu K. Agarwal et al.

It is certified that error appears in the above-identified patent and that said Letters Patent are hereby corrected as shown below:

Col. 6, line 14, please delete "16" and insert --"7"-- afer "claim".

Signed and Sealed this

Fifteenth Day of May, 2001

Attest:

NICHOLAS P. GODICI

Attesting Officer

Acting Director of the United States Patent and Trademark Office